United States Patent
Dobyns et al.

(10) Patent No.: US 9,291,646 B2
(45) Date of Patent: Mar. 22, 2016

(54) CROSS DOMAIN TRIGGERING IN A TEST AND MEASUREMENT INSTRUMENT

(75) Inventors: Kenneth P. Dobyns, Beaverton, OR (US); Gary J. Waldo, Hillsboro, OR (US); Kevin E. Cosgrove, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 748 days.

(21) Appl. No.: 13/560,735

(22) Filed: Jul. 27, 2012

(65) Prior Publication Data
US 2014/0032149 A1 Jan. 30, 2014

(51) Int. Cl.
*G01R 13/02* (2006.01)
*G06F 19/00* (2011.01)

(52) U.S. Cl.
CPC .................. *G01R 13/0254* (2013.01)

(58) Field of Classification Search
CPC .... G01R 13/0254; G01R 13/32; G01R 13/36; G01R 23/16; G01R 13/345; G01R 27/28; G01R 35/002
USPC ................ 702/66, 67, 70, 79, 183, 187, 106; 375/224; 709/224
See application file for complete search history.

(56) References Cited

U.S. PATENT DOCUMENTS

| | | |
|---|---|---|
| 7,191,079 B2 | 3/2007 | Smith et al. |
| 7,765,086 B2 * | 7/2010 | Hillman et al. ............... 702/183 |
| 8,452,571 B2 * | 5/2013 | Turpin ........................... 702/187 |
| 8,675,719 B2 * | 3/2014 | Dobyns et al. ................ 375/224 |
| 2011/0185059 A1 | 7/2011 | Adnani et al. |

FOREIGN PATENT DOCUMENTS

| | | |
|---|---|---|
| EP | 1669764 A1 | 6/2006 |
| EP | 2336791 A1 | 6/2011 |
| EP | 2434300 A1 | 3/2012 |

OTHER PUBLICATIONS

Hill: "Real-Time Spectrum Analysis Reveals Time Domain Charcteristics of Frequency Domain Signals", ARFTG Microwave Measurement Symposium, 2008 72nd, IEEE, Piscataway, NJ, USA, Dec. 9, 2008, pp. 102-108, XP031443984.

Sivula—Institute of Electrical and Electronics Engineers: "Next-Generation Devices and Networks Bring Opportunities and Challenges", Proceedings International Test Conference, New York, NY: IEEE, US, vol. 1, Sep. 30, 2003, p. 1319, XP010685369.

(Continued)

*Primary Examiner* — John H Le
(74) *Attorney, Agent, or Firm* — Meagher Emanuel Laks Roehling & Goldberg, LLP; Andrew J. Harrington; Marger Johnson

(57) ABSTRACT

An apparatus and method for triggering an oscilloscope is disclosed. The oscilloscope is configured to process a first signal in a first domain and a second signal in a second domain. The method includes choosing a different domain for processing each of the first and second signals, respectively. A desired trigger type is selected for one of the chosen domains. The first and second signals are acquired in response to an occurrence of a trigger of the selected trigger type. The first and second signals are processed according to the selected different chosen domains. The method may also include displaying a result of said processing on a display screen.

54 Claims, 9 Drawing Sheets

(56) References Cited

OTHER PUBLICATIONS

Xiao: "A New Signal Capture Method Based on Real-Time Multi-Domain Trigger in Communication Analyzer", Testing and Diagnosis, 2009. IEEE Circuits and Systems International Conference on, IEEE, Piscataway, NJ, USA, Apr. 28, 2009, pp. 1-4, XP031460395.
European Search Report and Written Opinion for Application No. 13178417.5, dated Nov. 7, 2013, 6 pages.

* cited by examiner

CROSS DOMAIN TRIGGERING IN A TEST AND MEASUREMENT INSTRUMENT

FIELD OF INVENTION

This invention relates to the field of test and measurement instruments and in particular triggering techniques for mixed domain oscilloscopes.

BACKGROUND

Modern digital oscilloscopes generally provide the capability to generate a time domain waveform of a given input signal. Traditionally, oscilloscopes have been limited to evaluating time domain phenomenon for triggering. Likewise, real-time spectrum analyzers have focused on evaluating frequency domain phenomenon, supplemented with limited time domain criteria (such as an external gate). Also, wireless communication analyzers acquire and demodulate signals to evaluate modulation domain characteristics. With the introduction of the mixed domain oscilloscope, it is possible to monitor signals in both the time and frequency domain simultaneously, with time correlated acquisition and display. However, existing mixed domain oscilloscopes lack adequate triggering functionality. Accordingly, there exists a need to provide improved triggering techniques that can extend the measurement capabilities of this new class of instrument.

SUMMARY OF THE INVENTION

A method for triggering an oscilloscope is disclosed. The oscilloscope is configured to process a first signal in a first domain and a second signal in a second domain. The method includes choosing a different domain for processing each of the first and second signals, respectively. A desired trigger type is selected for one of the chosen domains. The first and second signals are acquired in response to an occurrence of a trigger of the selected trigger type. The first and second signals are processed according to the selected different chosen domains. The method may also include displaying a result of said processing on a display screen.

The first domain and second domain may be one of a time domain, frequency domain, RF time domain and a modulation domain. The trigger may be based on a logical combination of events occurring in the first and second domains. The trigger may be based on a sequence of events occurring in the first and second domains. The trigger may be based on a logical combination and a sequence of events occurring in the first and second domains. The trigger may be based on at least one of the following time domain events, edge, width, timeout, pulse width, logic, setup/hold, rise time, fall time, video and bus. The trigger may be based on at least one of the following frequency domain events, frequency mask and frequency density. The trigger may be based on at least one of the following RF time domain events, edge, pulse width, timeout, runt, logic, setup/hold, rise time and fall time. The trigger may be based on at least one of the following modulation domain events, constellation mask event, error vector magnitude (EVM), magnitude error, phase error, complementary cumulative distribution function (CCDF), modulation error ratio and symbol error count/rate.

Another method for triggering an oscilloscope is disclosed. The oscilloscope is configured to process a signal in a first domain and in a second domain. The method includes choosing two different domains for processing the signal. A desired trigger type is selected for one of the chosen domains. The signal is acquired in response to an occurrence of a trigger of the selected trigger type. The signal is processed according to the selected different chosen domains. The method may also include displaying a result of said processing on a display screen.

A mixed domain test and measurement device is disclosed. The device is configured to process a first signal in a first domain and a second signal in a second domain. The device includes a processor configured to receive a domain selection, wherein a different domain is selected for processing each of the first and second signals, respectively. The processor is configured to receive a desired trigger type for one of the chosen domains. A trigger detector is configured to generate a trigger output based on the first and second signals and the desired trigger type. The processor is configured to acquire the first and second signals in response to the trigger output. The processor is configured to process the first and second signals according to the selected different chosen domains. The device may also include a display screen configured to display a result of the processing.

The first domain and second domain may be one of a time domain, frequency domain, RF time domain and a modulation domain. The trigger output may be based on a logical combination of events occurring in the first and second domains. The trigger output may be based on a sequence of events occurring in the first and second domains. The trigger output may be based on a logical combination and a sequence of events occurring in the first and second domains. The trigger output may be based on at least one of the following time domain events, edge, width, timeout, pulse width, logic, setup/hold, rise time, fall time, video and bus. The trigger output may be based on at least one of the following frequency domain events, frequency mask and frequency density. The trigger output may be based on at least one of the following RF time domain events, edge, pulse width, timeout, runt, logic, setup/hold, rise time and fall time. The trigger output may be based on at least one of the following modulation domain events, constellation mask event, error vector magnitude (EVM), magnitude error, phase error, complementary cumulative distribution function (CCDF), modulation error ratio and symbol error count/rate.

Another mixed domain test and measurement device is disclosed. The device is configured to process a signal in a first domain and in a second domain. The device includes a processor configured to receive selection of two different domains for processing the signal. The processor is configured to receive a desired trigger for one of the chosen domains. A trigger detector is configured to generate a trigger output based on the signal and the desired trigger type. The processor is configured to acquire the signal in response to the trigger output. The processor is configured to process the signals according to said selected different chosen domains. The device may also include a display screen configured to display a result of said processing.

Another method for triggering an oscilloscope is also disclosed. The oscilloscope is configured to process a first signal and a second signal in a frequency domain. The method includes selecting a different desired trigger type for each of the first and second signals. The first and second signals are acquired in response to an occurrence of triggers of the selected trigger types. The first and second signals are processed according to the frequency domain.

The method may also include displaying a result of said processing on a display screen. The triggers may be based on a logical combination of events occurring in said frequency domain. The triggers may be based on a sequence of events occurring in said frequency domain. The triggers may be based on a logical combination and a sequence of events occurring in said frequency domain. The triggers may be based on at least one of the following frequency domain events, frequency mask and frequency density.

Another test and measurement device is also disclosed. The device is configured to process a first signal and a second signal in a frequency domain. The device includes a processor configured to receive a different desired trigger type for each of said first and second signals. A trigger detector is configured to generate a trigger output based on the first and second signals and the desired trigger types. The processor is configured to acquire the first and second signals in response to the trigger output. The processor is configured to process the first and second signals according to the frequency domain.

The device may include a display screen configured to display a result of said processing. The trigger output may be based on a logical combination of events occurring in said frequency domain. The trigger output may be based on a sequence of events occurring in said frequency domain. The trigger output may be based on a logical combination and a sequence of events occurring in said frequency domain. The trigger output may be based on at least one of the following frequency domain events, frequency mask and frequency density.

DETAILED DESCRIPTION OF THE INVENTION

This disclosure enumerates the various combined trigger functionality that are made possible in this new class of instrument. In addition, it discloses several single domain variations that have not been previously implemented.

A mixed domain oscilloscope may have real-time visibility of four types of data: i) time domain, e.g., traditional oscilloscope V vs. T signals, ii) frequency domain, e.g., derived, via FFT, from time domain signals, iii) RF time domain, e.g., derived, via IQ data processing, from time domain signals, and iv) Modulation domain data, e.g., derived via demodulation of RF time domain signals.

Measurement instruments, such as oscilloscopes may generally generate triggers in one of three ways: i) single channel, e.g., observing a single input for some identifiable phenomenon, such as an edge or a frequency variation; ii) multiple channel logic, e.g., observing multiple inputs for some combination of identifiable phenomenon, such as a logic state or a setup/hold violation, multiple channel logic criteria can be logically combined, e.g., AND, OR, NAND, NOR, or some combination thereof; or iii) a multiple channel sequence, e.g., observing multiple inputs for some sequence of identifiable phenomenon, such as a voltage dip on a channel after a specific serial word is recognized in a second channel. It should be noted that a variation of the multiple channel sequence trigger is a single channel sequence trigger, where the sequence of events is defined on a single channel.

Figure 1:
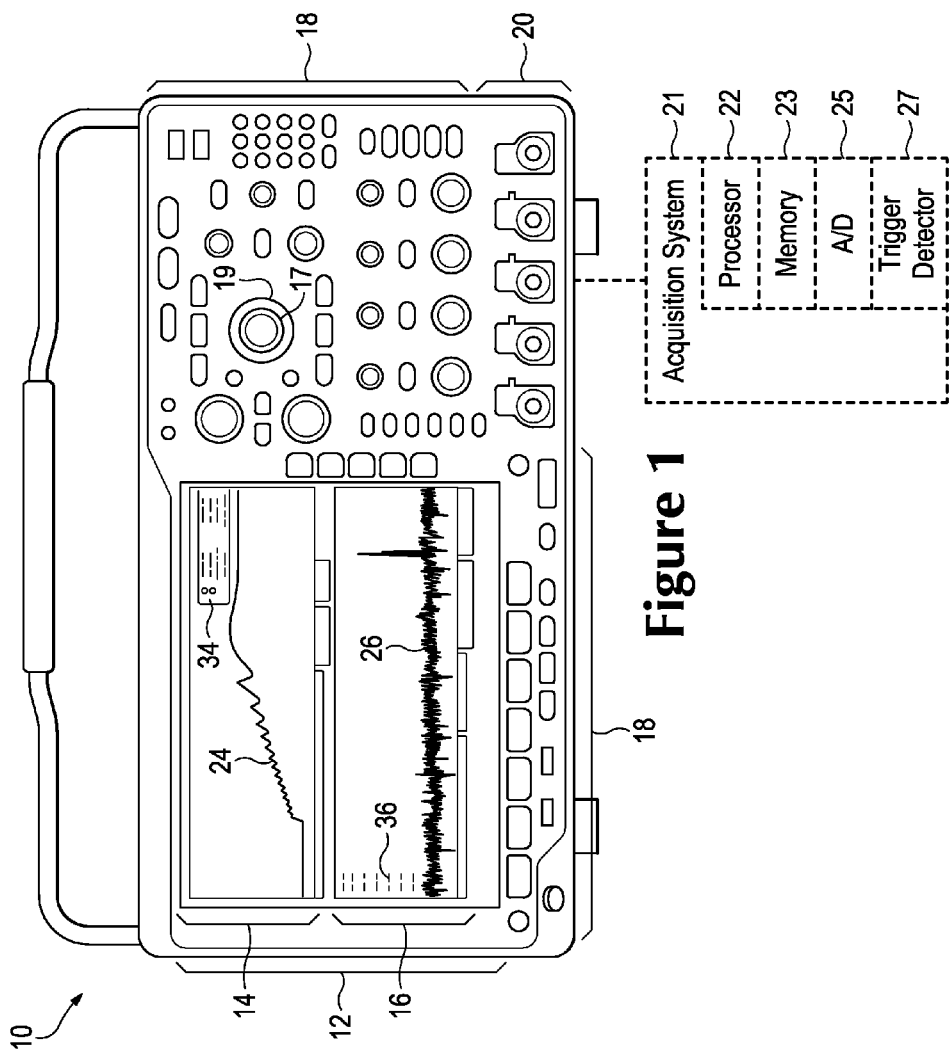
FIG. 1 is a diagram of a mixed domain oscilloscope having a display that is divided into a plurality of display areas.

FIG. 1 is a diagram of a mixed domain oscilloscope 10 having a display 12 that is divided into a plurality of display areas or graticules 14, 16. The graticules 14, 16 are configured to graphically display at least one waveform 24, 26 and other graphical indicia 34, 36 for example axes, graphical information and text. The oscilloscope 10 also has a plurality of user controls 18 configured for user input and a plurality of electrical inputs 20 configured to receive test signals and the like. In this example, user controls 18 include a zoom input 17 (inner knob) and a pan input 19 (outer knob) configured to vary the zoom factor and pan position (zoom box position).

In this example, the oscilloscope 10 is implemented as a stand-alone unit with an acquisition system 21 including a processor 22 having an associated memory 23 configured for storage of program information and data. It should be understood that processor 22 may be coupled to additional circuitry, e.g., I/O, graphics generation hardware and the like. The processor 22 is configured to receive at least a portion of the inputs via the user controls 18. Analog to digital (A/D) converter 25 is configured to digitize signals received on electrical inputs 20. Trigger detector (trigger system) 27 provides timing signals for controlling the acquisition process as discussed below. A variety of triggering modes is disclosed in U.S. Pat. No. 7,191,079 which is incorporated herein in its entirety.

The processor 22 is also configured to generate at least a portion of the information displayed in the graticules 14, 16. It should be understood that the oscilloscope may be implemented using a variety of hardware and software including embodiments implemented using computing devices, e.g., desktop, laptop, tablet, smart phone or other computing devices, and that some of these systems may or may not provide or require a display device. A digitizer is an example of a system without a display or graticules.

Figure 2A:
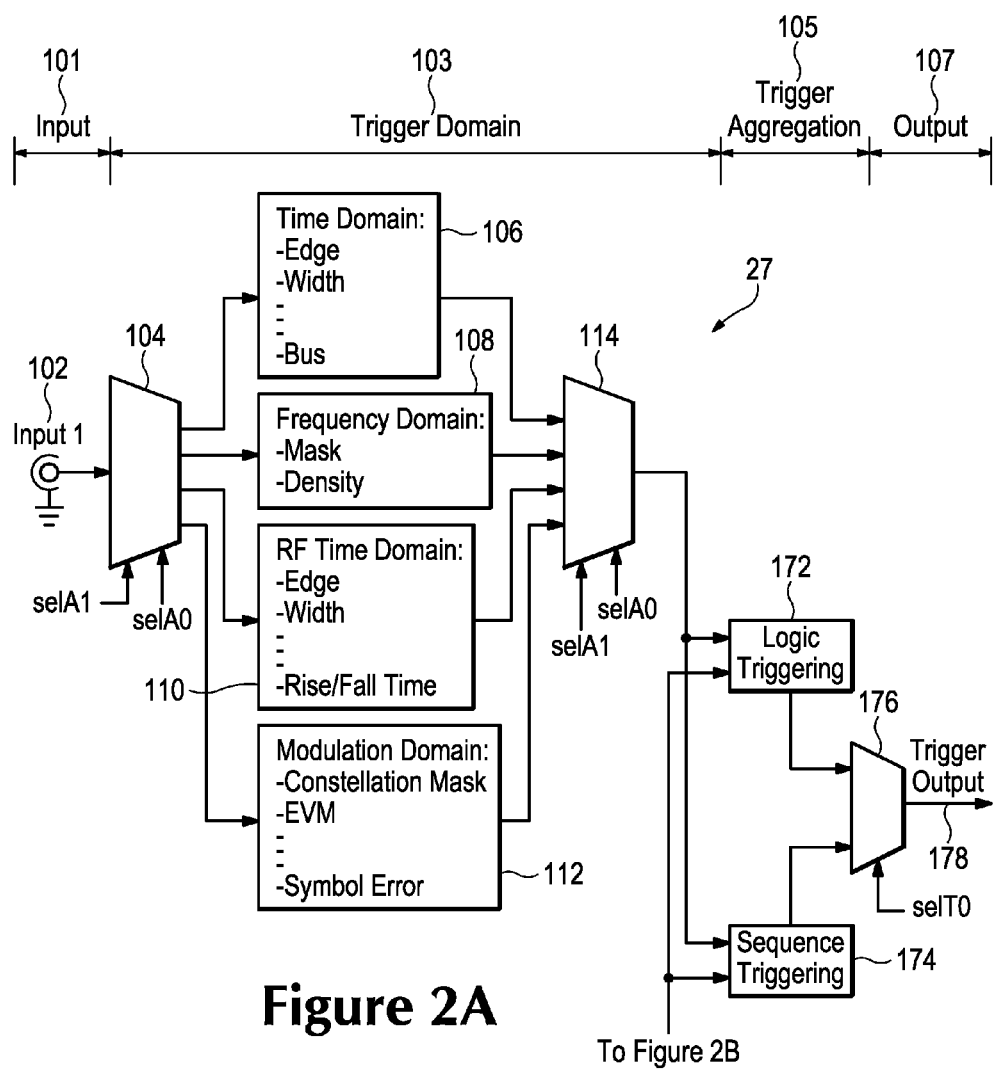
FIG. 2 is a block diagram of a trigger detector.
Figure 2B:
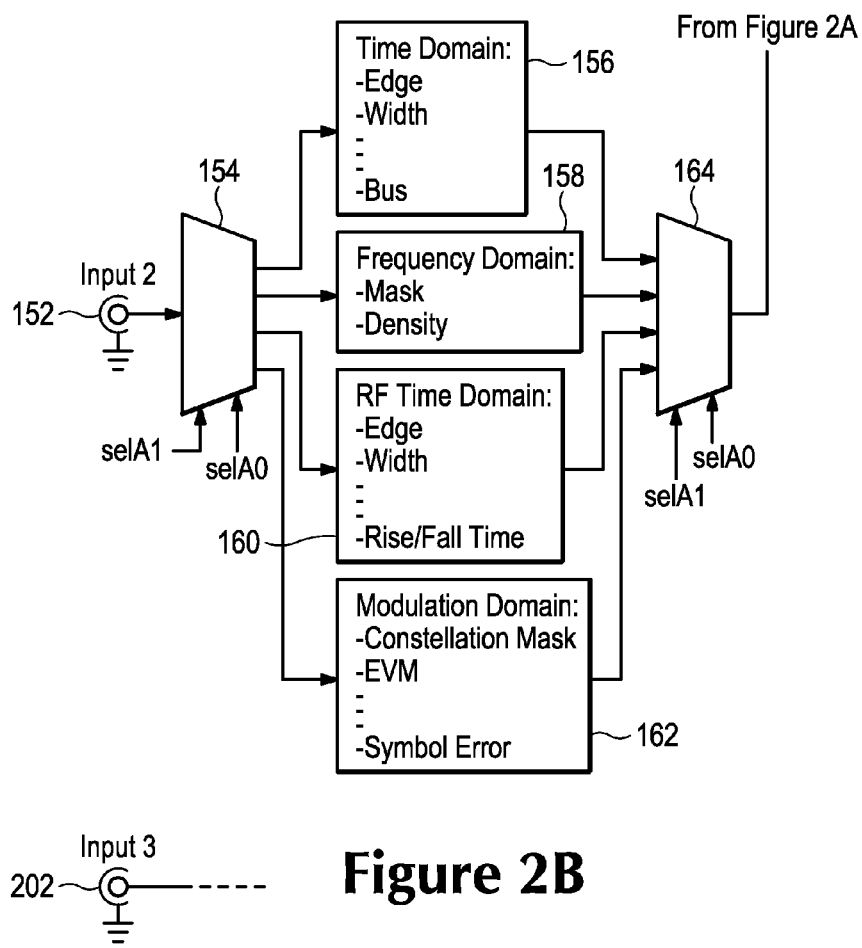
Figure 2B:
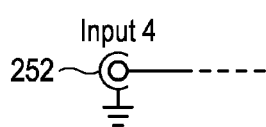

FIG. 2 is a block diagram of a trigger detector 27. Trigger detector 27 includes an input portion 101, trigger domain portion 103, trigger aggregation portion 105 and an output portion 107. In this example, detailed block diagrams are shown for inputs 1 and 2, 102, 152. It should be understood that trigger domain circuitry may also be provided for additional inputs such as inputs 3 and 4 as shown generally by reference numbers 202 and 252. The trigger domain portion 103 generally includes an input multiplexer 104, 154, output multiplexer 114, 164 and a plurality of domain specific trigger circuits, e.g., time domain trigger circuits 106, 156, frequency domain trigger circuits 108, 158, RF time domain trigger circuits 110, 160 and modulation domain trigger circuits 112, 162. Configuration of suitable trigger domain circuitry is well known by those skilled in the art.

The trigger aggregation portion 105 includes a logic (qualified) triggering portion 172 and sequence triggering portion 174 coupled to a trigger output multiplexer 176. This configuration allows for generation of a trigger output 178 based on signals in multiple domains.

Figure 3:
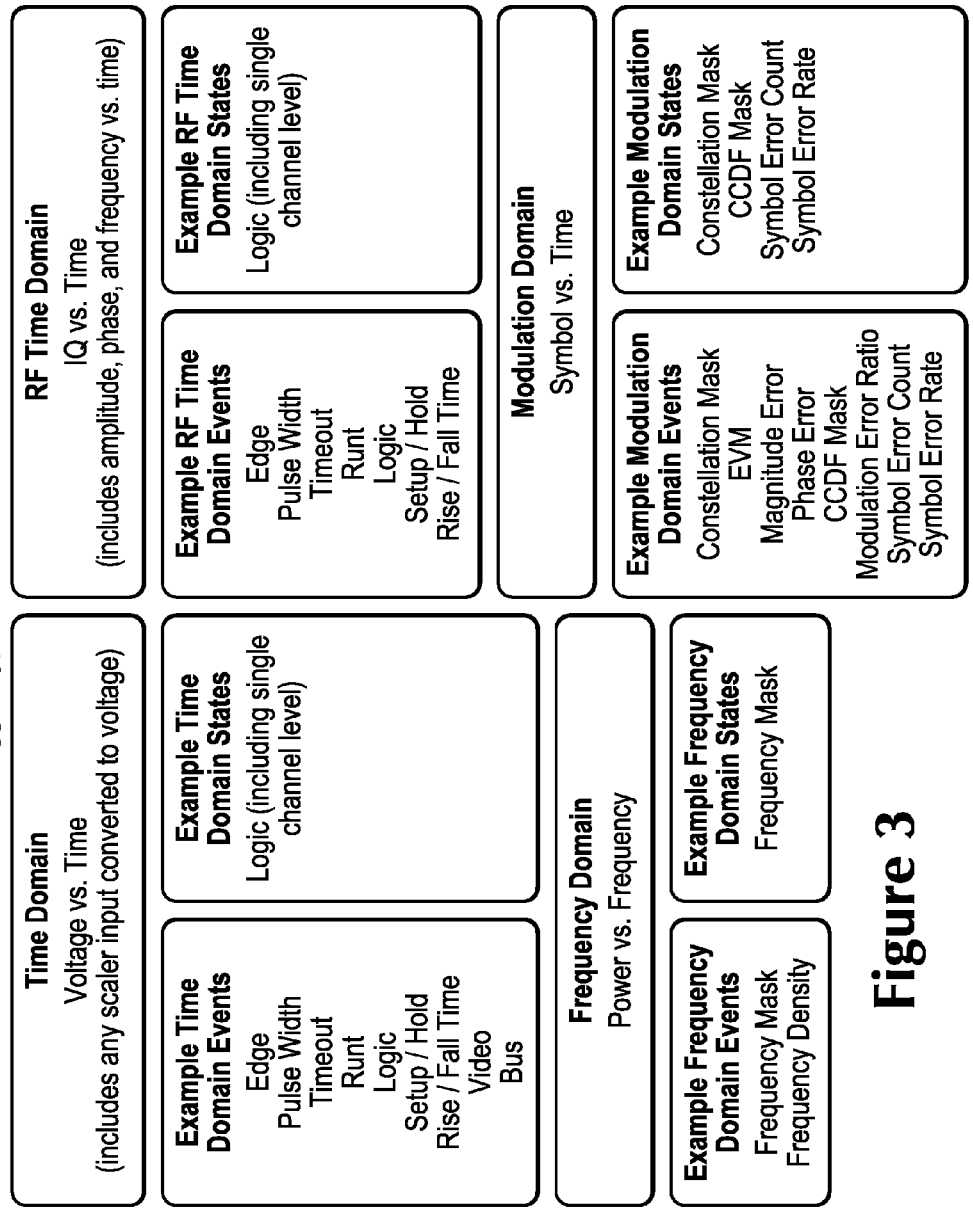
FIG. 3 is a block diagram showing a variety of trigger types in each domain.
Figure 4:
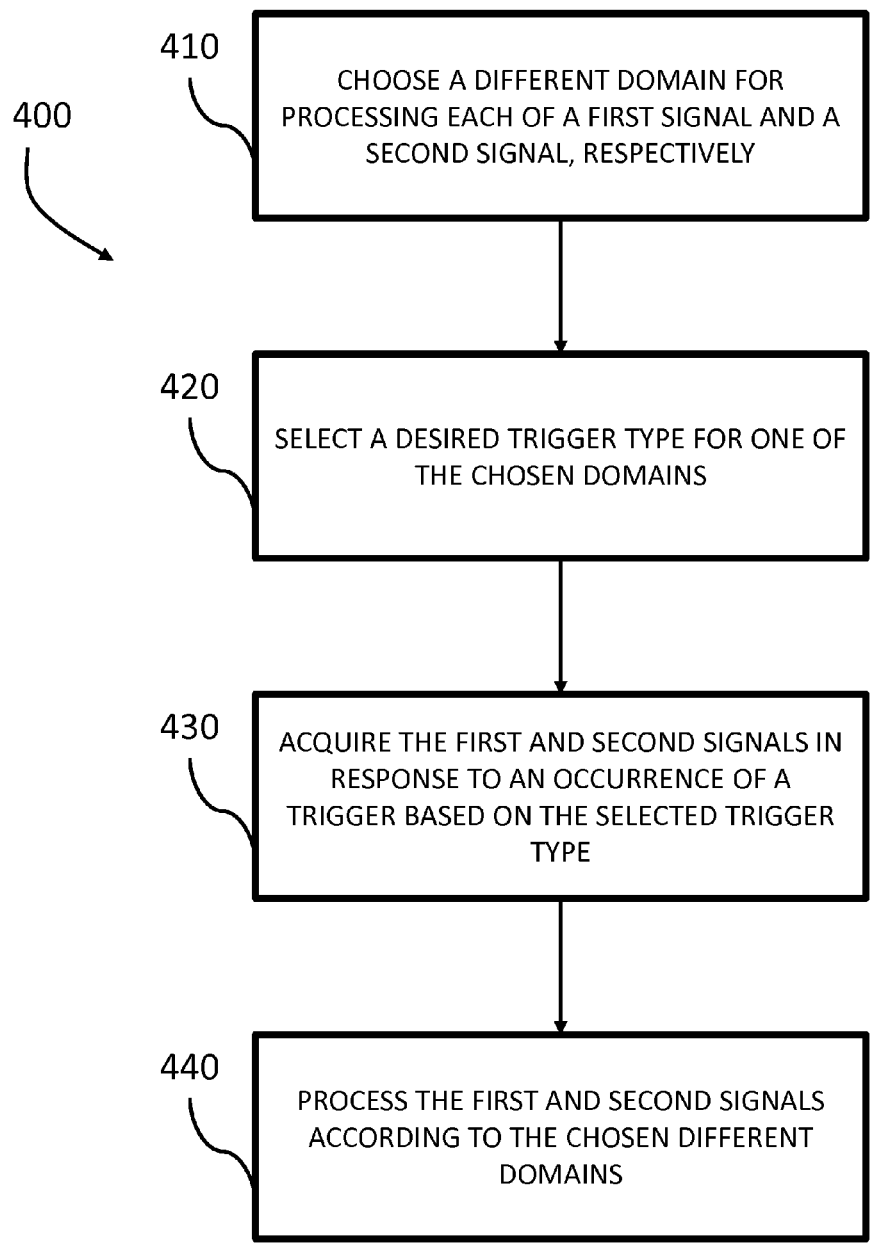
FIGS. 4-8 are each a flowchart of a method for triggering an oscilloscope, according to embodiments of the invention.
Figure 5:
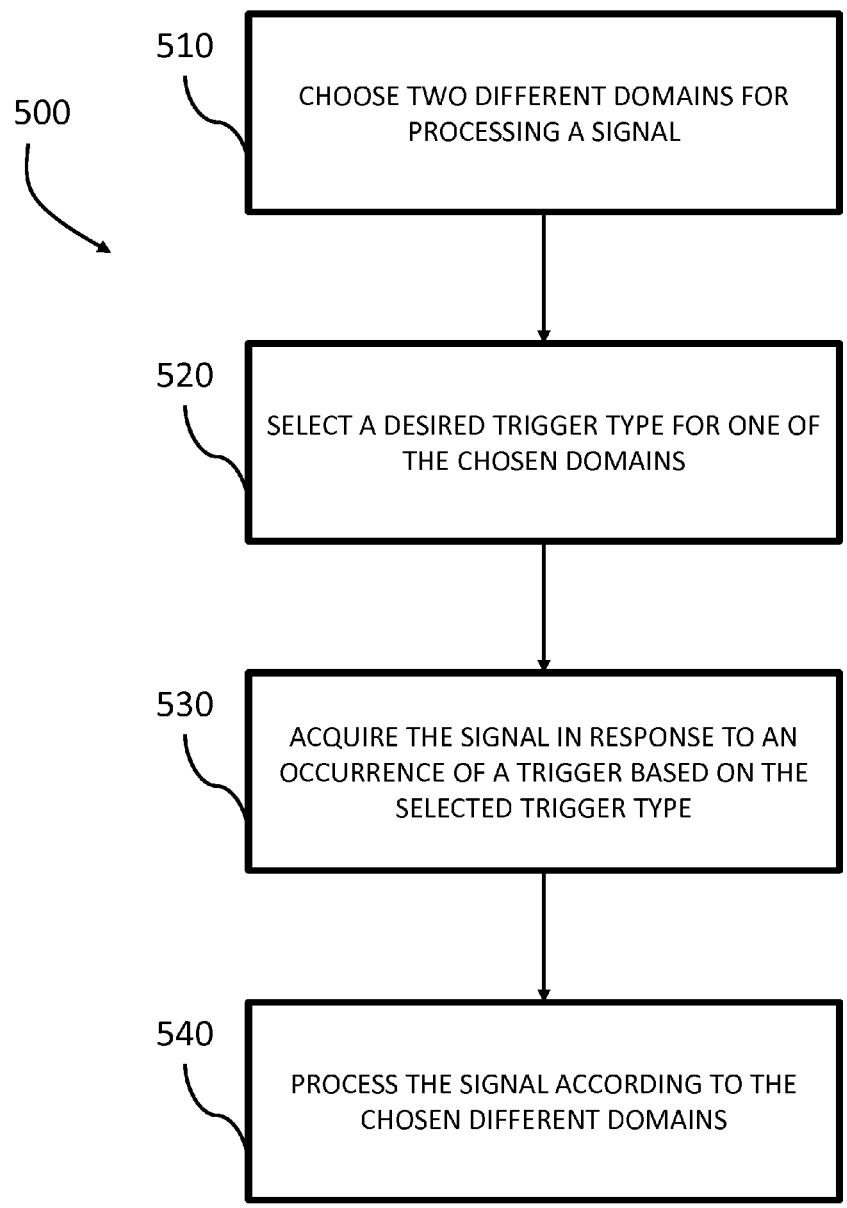
Figure 6:
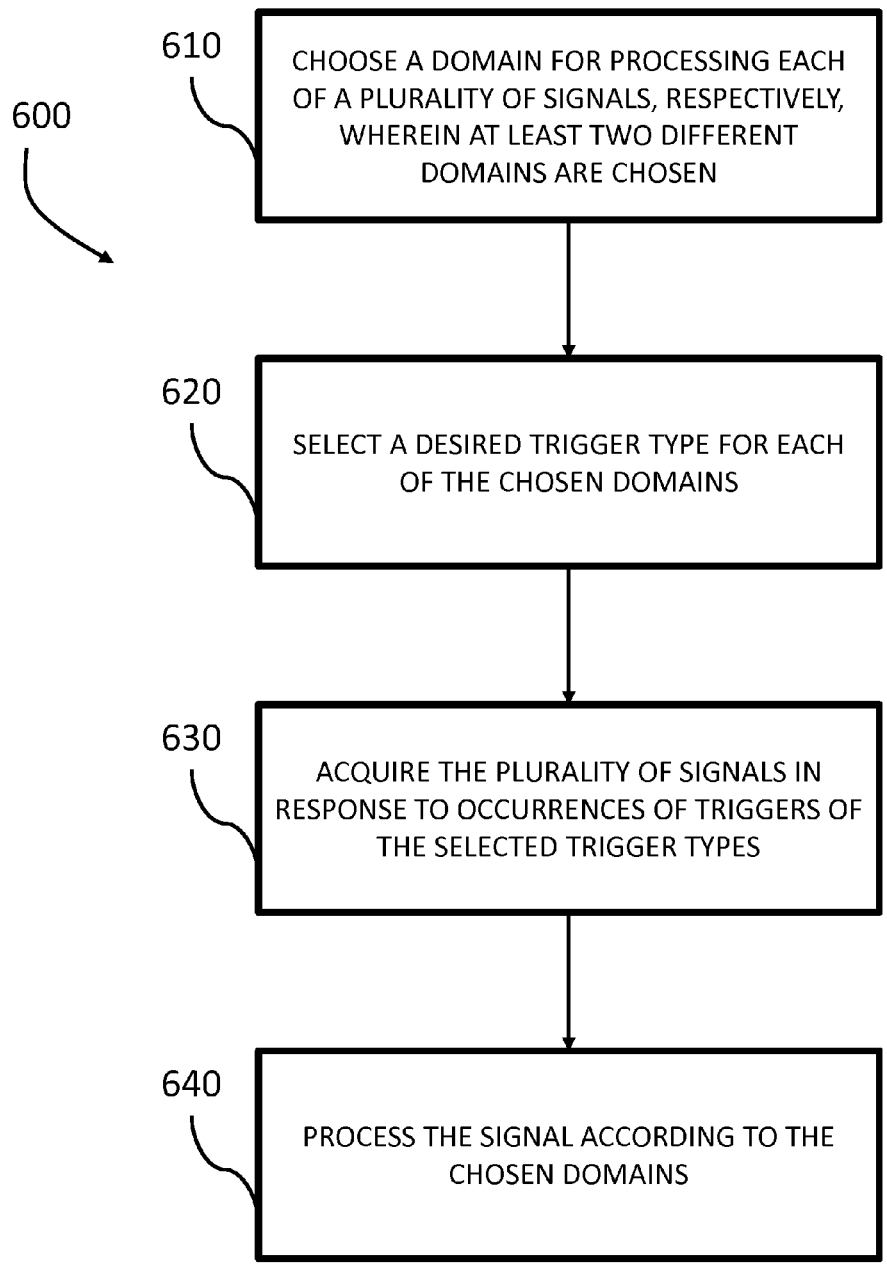
Figure 7:
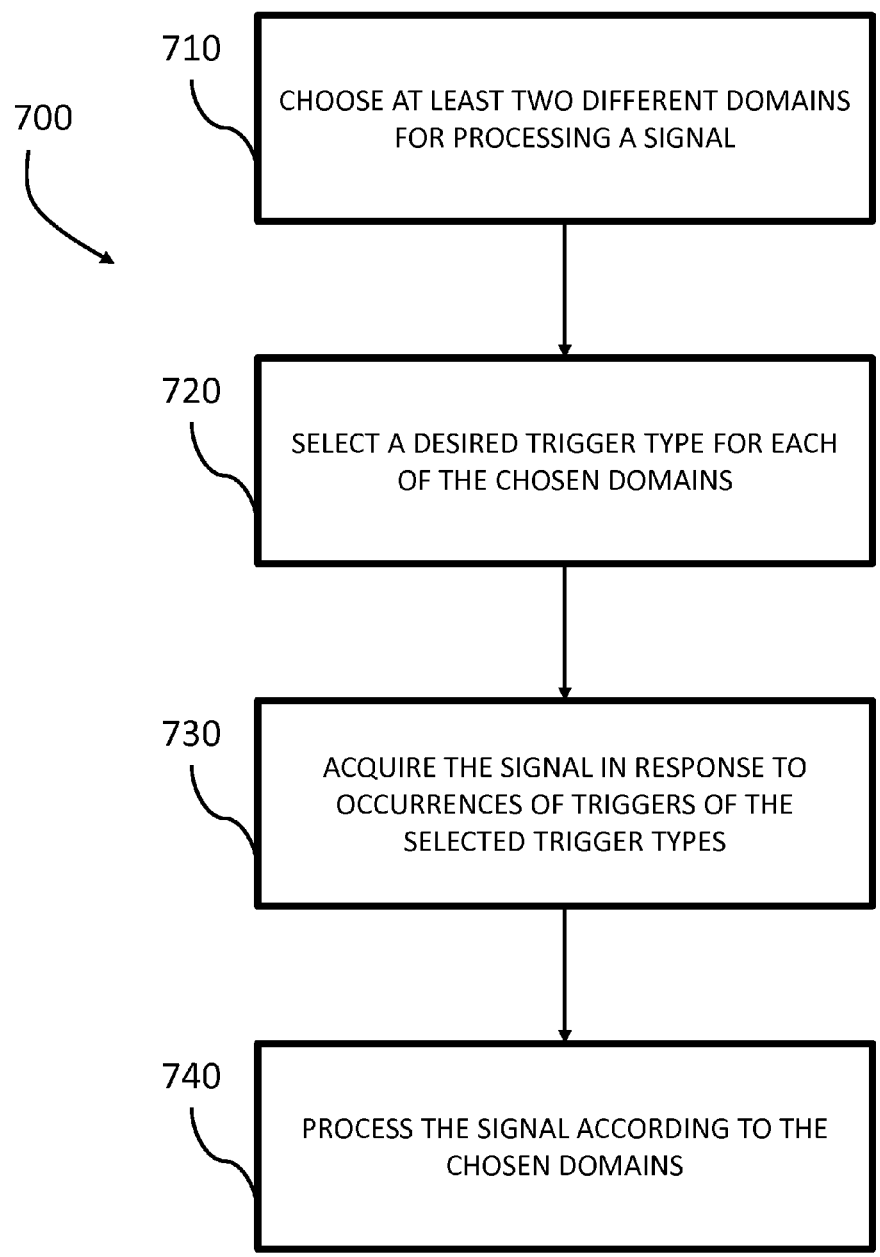
Figure 8:
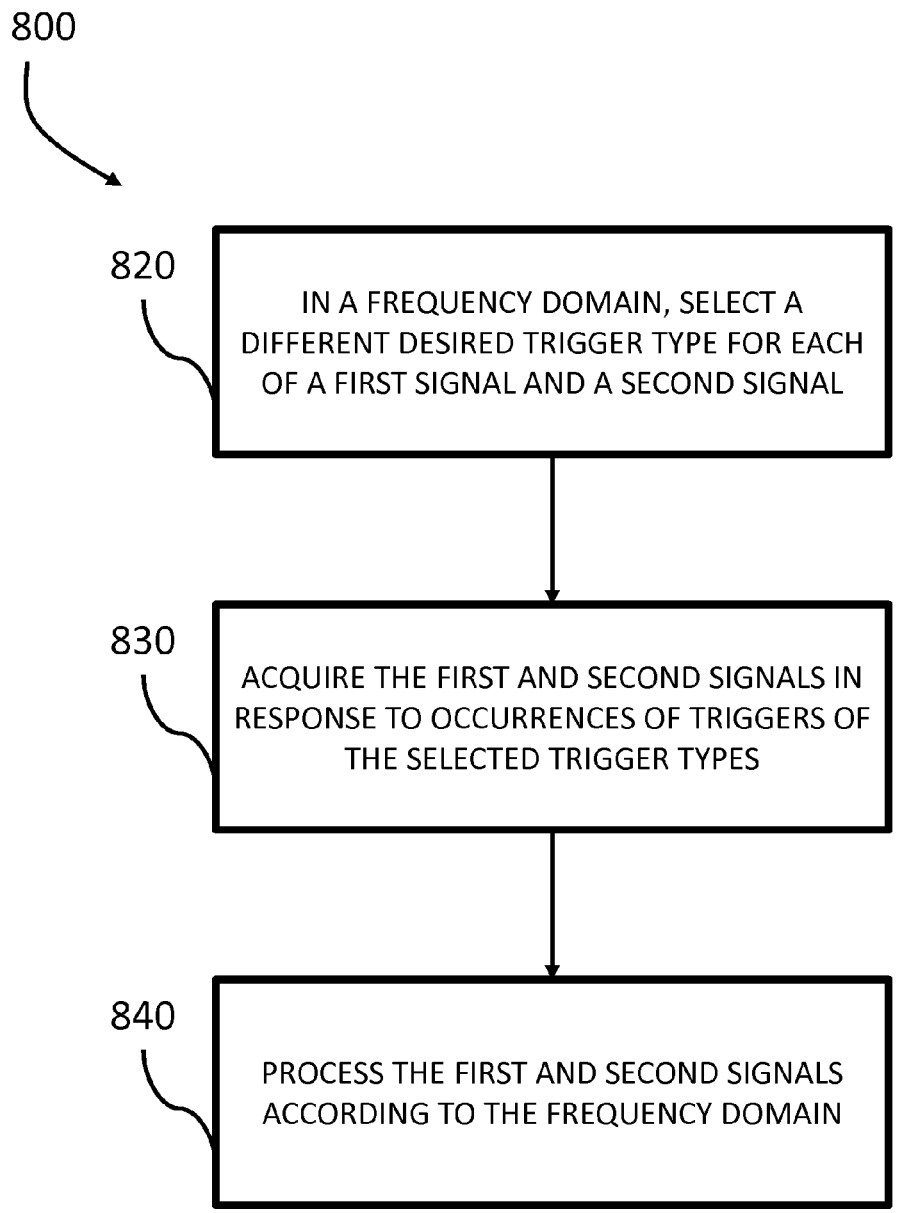

In general, triggering may be accomplished using qualified triggering (multiple channel logic) or sequence triggering (multiple channel sequence). In general an event is a characteristic of one or more input signals that occurs at a specific point in time. That is, an event happens at a point in time. A state is a characteristic of one or more input signals that exists for a period of time. That is, a state either exists or it does not exist. For qualified triggering the trigger detector looks for an event. The trigger detector also monitors one or more states. The trigger detector generates a trigger when the event occurs but only if the state(s) is true. For sequence triggering, the trigger detector looks for a first event. After recognizing the first event, the trigger detector arms and looks for one or more subsequent events. The trigger detector generates a trigger when the last or final event occurs. Logic and sequence trigger may be used together, in that a trigger will be generated only after a sequence of events occurs while a qualifying state is present FIG. 3 is a block diagram showing a variety of trigger types in each domain. The time domain is generally used to visualize voltage vs. time. Typical time domain events include: edge, pulse width, timeout, runt, logic, setup/hold, rise time, fall time, video and bus as discussed above. Typical time domain states include: logic including single channel level. The frequency domain is generally used to visualize power vs. frequency. Typical frequency domain events include: frequency mask and frequency density. Typical frequency domain states include: states based on a frequency mask.

The RF time domain is generally used to visualize IQ vs. time (this includes amplitude, phase and frequency vs. time). Typical RF time domain events include: edge, pulse width, timeout, runt, logic, setup/hold, rise time and fall time. Typical RF time domain states include: logic including single channel level. The modulation time domain is generally used to visualize symbol vs. time. Typical modulation time domain events include: constellation mask, error vector magnitude (EVM), magnitude error, phase error, complementary cumulative distribution function (CCDF) error, modulation error ratio, symbol error count, and symbol error rate. Typical modulation time domain states include: constellation mask, CCDF mask, symbol error count and symbol error rate.

It should be understood that a wide variety of mixed domain trigger modes are encompassed by this disclosure including but not limited to the following examples:

Multiple Channel Logic: Frequency Domain:

Monitor two different frequency domain signals with frequency mask or frequency density triggering. Trigger when there are simultaneous events on both signals.

Multiple Channel Logic: Time and Frequency Domains:

Monitor one time domain and one frequency domain signal. Trigger on a frequency mask event, but only when the time domain signal is high.

Multiple Channel Logic: Time and RF Time Domain:

Monitor one time domain and one RF time domain signal. Trigger on the amplitude of the RF time domain signal, but only when the time domain signal is high.

Multiple Channel Logic: Modulation Domain and RF Time Domain:

Monitor one modulation domain signal and one RF time domain signal. When the RF time domain channel is above a certain threshold, then trigger on modulation domain constellation mask event.

Multiple Channel Logic: Modulation Domain and Frequency Domain:

Monitor one modulation domain signal and one frequency domain signal. When the modulation domain symbol error rate is above a threshold, then trigger on a frequency domain density event.

Multiple Channel Logic: Modulation Domain and Time Domain:

Monitor one modulation domain signal and one time domain signal. After a time domain bus event, then trigger on a modulation domain constellation mask event.

Multiple Channel Logic: Frequency and RF Time Domains:

Monitor one frequency domain signal and one RF time domain signal. Trigger on a frequency density event, but only when the amplitude of the RF time domain signal is above a predetermined level.

Multiple Channel Logic: Time, Frequency, and RF Time Domains:

Monitor multiple time domain signals, one frequency domain signal, and one RF time domain signal. Trigger on a frequency mask event, but only when the other RF time domain signal, and the time domain signals' logic state matches a predetermined word.

Multiple Channel Sequence: Frequency Domain:

Monitor two different frequency domain signals with frequency mask or frequency density triggering. Use an event on one frequency domain signal to arm the trigger system to look for an event on the second frequency domain signal.

Multiple Channel Sequence: RF Time Domain:

Monitor two different frequency domain signals. When the power level of the first frequency domain signal exceeds a predetermined amplitude, arm the trigger system to trigger on a frequency density event on the second frequency domain signal.

Multiple Channel Sequence: Time and Frequency Domains:

Monitor one time domain and one frequency domain signal. When a runt is detected on the time domain signal, arm the trigger system to look for a frequency mask failure on the frequency domain signal.

Multiple Channel Sequence: Time and RF Time Domains:

Monitor one time domain and one RF time domain signal. When a setup/hold event is detected on the RF time domain signal, arm the trigger system to trigger when a serial word is recognized on the time domain signal.

Multiple Channel Sequence: Frequency and RF Time Domains:

Monitor one frequency domain and one RF time domain signal. When the pulse width of the RF time domain signal exceeds a specified time, arm the trigger system to trigger on a frequency density event on the other frequency domain signal.

Multiple Channel Sequence: Time, Frequency, and RF Time Domains:

Monitor multiple time domain, one frequency domain, and one RF time domain signal. When the time domain signals' logic state matches a predetermined word, observe the frequency domain signal. When a frequency mask event is noted on said frequency domain signal, arm the trigger system to trigger when a timeout event occurs on the RF time domain signal.

It should be understood that many variations are possible based on the disclosure herein. Although features and elements are described above in particular combinations, each feature or element can be used alone without the other features and elements or in various combinations with or without other features and elements. The apparatus or methods disclosed herein may be implemented in a computer program, software, or firmware incorporated in a computer-readable (non-transitory) storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A method for triggering an oscilloscope, said oscilloscope being configured to process a first signal in a first domain and a second signal in a second domain, said method comprising:
choosing a different domain for processing each of said first and second signals, respectively;
selecting a desired trigger type for one of said chosen domains;
acquiring said first and second signals in response to an occurrence of a trigger based on said selected trigger type; and
processing said first and second signals according to said chosen different domains.

2. The method of claim 1, further comprising displaying a result of said processing on a display screen.

3. The method of claim 1, wherein the first domain and the second domain are each chosen from the group consisting of time domain, frequency domain, RF time domain and modulation domain.

4. The method of claim 1, wherein the trigger is based on a logical combination of events occurring in the first and second domains.

5. The method of claim 1, wherein the trigger is based on a sequence of events occurring in the first and second domains.

6. The method of claim 1, wherein the trigger is based on a logical combination and a sequence of events occurring in the first and second domains.

7. The method of claim 1, wherein the trigger is based on at least one time domain event selected from the group consisting of edge, width, timeout, pulse width, logic, setup/hold, rise time, fall time, video and bus.

8. The method of claim 1, wherein the trigger is based on at least one frequency domain event selected from the group consisting of frequency mask and frequency density.

9. The method of claim 1, wherein the trigger is based on at least one RF time domain event selected from the group consisting of edge, pulse width, timeout, runt, logic, setup/hold, rise time and fall time.

10. The method of claim 1, wherein the trigger is based on at least one modulation domain event selected from the group consisting of constellation mask, error vector magnitude (EVM), magnitude error, phase error, complementary cumulative distribution function (CCDF), modulation error ratio, symbol error count and symbol error rate.

11. A method for triggering an oscilloscope, said oscilloscope being configured to process a signal in a first domain and in a second domain, said method comprising:
choosing two different domains for processing said signal;
selecting a desired trigger type for one of said chosen domains;
acquiring said signal in response to an occurrence of a trigger based on said selected trigger type; and
processing said signal according to said chosen different domains.

12. The method of claim 11, further comprising displaying a result of said processing on a display screen.

13. A mixed domain test and measurement device configured to process a first signal in a first domain and a second signal in a second domain, said device comprising:
a processor configured to receive a domain selection, wherein a different domain is selected for processing each of said first and second signals, respectively;
the processor being configured to receive a desired trigger type for one of said selected domains;
a trigger detector configured to generate a trigger output based on the first and second signals and the desired trigger type;
the processor being configured to acquire said first and second signals in response to the trigger output;
the processor being configured to process said first and second signals according to said selected different domains.

14. The device of claim 13, further comprising a display screen configured to display a result of said processing.

15. The device of claim 13, wherein the first domain and the second domain are each selected from the group consisting of time domain, frequency domain, RF time domain and modulation domain.

16. The device of claim 13, wherein the trigger output is based on a logical combination of events occurring in the first and second domains.

17. The device of claim 13, wherein the trigger output is based on a sequence of events occurring in the first and second domains.

18. The device of claim 13, wherein the trigger output is based on a logical combination and a sequence of events occurring in the first and second domains.

19. The device of claim 13, wherein the trigger output is based on at least one time domain event selected from the group consisting of edge, width, timeout, pulse width, logic, setup/hold, rise time, fall time, video and bus.

20. The device of claim 13, wherein the trigger output is based on at least one frequency domain event selected from the group consisting of frequency mask and frequency density.

21. The device of claim 13, wherein the trigger output is based on at least one RF time domain event selected from the group consisting of edge, pulse width, timeout, runt, logic, setup/hold, rise time and fall time.

22. The device of claim 13, wherein the trigger output is based on at least one modulation domain event selected from the group consisting of constellation mask event, error vector magnitude (EVM), magnitude error, phase error, complementary cumulative distribution function (CCDF), modulation error ratio, symbol error count and symbol error rate.

23. A mixed domain test and measurement device configured to process a signal in a first domain and in a second domain, said device comprising:
a processor configured to receive selection of two different domains for processing said signal;
the processor being configured to receive a desired trigger type for one of said selected domains;
a trigger detector configured to generate a trigger output based on said signal and the desired trigger type;
the processor being configured to acquire said signal in response to the trigger output;
the processor being configured to process said signal according to said selected different domains.

24. The device of claim 23, further comprising a display screen configured to display a result of said processing.

25. A method for triggering an oscilloscope, said oscilloscope being configured to process a plurality of signals, each in one of a time domain, frequency domain, RF time domain, or modulation domain, said method comprising:
choosing a domain for processing each of said signals, respectively, wherein at least two different domains are chosen;
selecting a desired trigger type for each of said chosen domains;

acquiring said signals in response to occurrences of triggers of said selected trigger types; and processing said signals according to said chosen domains.

26. The method of claim 25, further comprising displaying a result of said processing on a display screen.

27. The method of claim 25, wherein at least one trigger is based on a logical combination of events occurring in the time domain, frequency domain, RF time domain, or modulation domain.

28. The method of claim 25, wherein at least one trigger is based on a sequence of events occurring in the time domain, frequency domain, RF time domain, or modulation domain.

29. The method of claim 25, wherein at least one trigger is based on a logical combination and a sequence of events occurring in the time domain, frequency domain, RF time domain, or modulation domain.

30. The method of claim 25, wherein at least one trigger is based on at least one time domain event selected from the group consisting of edge, width, timeout, pulse width, logic, setup/hold, rise time, fall time, video and bus.

31. The method of claim 25, wherein at least one trigger is based on at least one frequency domain event selected from the group consisting of frequency mask and frequency density.

32. The method of claim 25, wherein at least one trigger is based on at least one RF time domain event selected from the group consisting of edge, pulse width, timeout, runt, logic, setup/hold, rise time and fall time.

33. The method of claim 25, wherein at least one trigger is based on at least one modulation domain event selected from the group consisting of constellation mask, error vector magnitude (EVM), magnitude error, phase error, complementary cumulative distribution function (CCDF), modulation error ratio, symbol error count and symbol error rate.

34. A method for triggering an oscilloscope, said oscilloscope being configured to process a signal in a plurality of domains selected from a time domain, frequency domain, RF time domain, or modulation domain, said method comprising:

choosing at least two different domains for processing said signal;

selecting a desired trigger type for each of said chosen domains;

acquiring said signal in response to occurrences of triggers of said selected trigger types; and processing said signal according to said chosen domains.

35. The method of claim 34, further comprising displaying a result of said processing on a display screen.

36. The method of claim 34, wherein the trigger is based on a logical combination of events occurring in the time domain, frequency domain, RF time domain, or modulation domain.

37. The method of claim 34, wherein the trigger is based on a sequence of events occurring in the time domain, frequency domain, RF time domain, or modulation domain.

38. The method of claim 34, wherein the trigger is based on a logical combination and a sequence of events occurring in the time domain, frequency domain, RF time domain, or modulation domain.

39. The method of claim 34, wherein the trigger is based on at least one time domain event selected from the group consisting of edge, width, timeout, pulse width, logic, setup/hold, rise time, fall time, video and bus.

40. The method of claim 34, wherein the trigger is based on at least one frequency domain event selected from the group consisting of frequency mask and frequency density.

41. The method of claim 34, wherein the trigger is based on at least one RF time domain event selected from the group consisting of edge, pulse width, timeout, runt, logic, setup/hold, rise time and fall time.

42. The method of claim 34, wherein the trigger is based on at least one modulation domain event selected from the group consisting of constellation mask, error vector magnitude (EVM), magnitude error, phase error, complementary cumulative distribution function (CCDF), modulation error ratio, symbol error count and symbol error rate.

43. A method for triggering an oscilloscope, said oscilloscope being configured to process a first signal and a second signal in a frequency domain, said method comprising:

selecting a different desired trigger type for each of said first and second signals;

acquiring said first and second signals in response to occurrences of triggers of said selected trigger types; and processing said first and second signals according to said frequency domain.

44. The method of claim 43, further comprising displaying a result of said processing on a display screen.

45. The method of claim 43, wherein the triggers are based on a logical combination of events occurring in said frequency domain.

46. The method of claim 43, wherein the triggers are based on a sequence of events occurring in said frequency domain.

47. The method of claim 43, wherein the triggers are based on a logical combination and a sequence of events occurring in said frequency domain.

48. The method of claim 43, wherein the triggers are based on at least one of a frequency mask event or a frequency density event.

49. A test and measurement device configured to process a first signal and a second signal in a frequency domain, said device comprising:

a processor configured to receive a different desired trigger type for each of said first and second signals;

a trigger detector configured to generate a trigger output based on the first and second signals and the desired trigger types;

the processor being configured to acquire said first and second signals in response to the trigger output;

the processor being configured to process said first and second signals according to said frequency domain.

50. The device of claim 49, further comprising a display screen configured to display a result of said processing.

51. The device of claim 49, wherein the trigger output is based on a logical combination of events occurring in said frequency domain.

52. The device of claim 49, wherein the trigger output is based on a sequence of events occurring in said frequency domain.

53. The device of claim 49, wherein the trigger output is based on a logical combination and a sequence of events occurring in said frequency domain.

54. The device of claim 49, wherein the trigger output is based on at least one of a frequency mask event or a frequency density event.

* * * * *